United States Patent
Oonishi

(10) Patent No.: US 8,018,020 B2
(45) Date of Patent: Sep. 13, 2011

(54) SCHOTTKY BARRIER DIODE AND MANUFACTURING METHOD THEREOF

(75) Inventor: Kazuhiro Oonishi, Osaka (JP)

(73) Assignee: Panasonic Corporation, Osaka (JP)

( * ) Notice: Subject to any disclaimer, the term of this patent is extended or adjusted under 35 U.S.C. 154(b) by 292 days.

(21) Appl. No.: 12/201,366

(22) Filed: Aug. 29, 2008

(65) Prior Publication Data

US 2009/0057807 A1 Mar. 5, 2009

(30) Foreign Application Priority Data

Aug. 30, 2007 (JP) ............................... P2007-223792

(51) Int. Cl.
*H01L 29/872* (2006.01)

(52) U.S. Cl. . 257/475; 257/471; 257/473; 257/E29.338; 438/534

(58) Field of Classification Search .................. 257/471, 257/473, 475, 478, E29.338, E21.359; 438/534
See application file for complete search history.

(56) References Cited

U.S. PATENT DOCUMENTS

| | | | | |
|---|---|---|---|---|
| 2005/0184406 | A1* | 8/2005 | Okada et al. .................. | 257/928 |
| 2006/0138450 | A1* | 6/2006 | Lanois et al. ................. | 257/109 |

FOREIGN PATENT DOCUMENTS

| | | |
|---|---|---|
| JP | 7-50791 | 2/1995 |
| JP | 2000-261004 | 9/2000 |
| JP | 2005-243716 | 9/2005 |

* cited by examiner

*Primary Examiner* — Thinh T Nguyen
(74) *Attorney, Agent, or Firm* — McDermott Will & Emery LLP

(57) ABSTRACT

The invention provides a Schottky barrier diode in which a forward voltage is low, a backward leakage current is small, and a withstanding voltage of an element is high, by improving both the forward voltage VF and the backward leakage current IR. A Schottky barrier diode of the invention includes a semiconductor substrate whose surface is provided with a semiconductor layer of first conduction type, a plurality of semiconductor layers of second conduction type provided as junction barriers at a predetermined depth from the surface of the semiconductor layer of first conduction type, an annular shape guard ring comprised of a semiconductor layer of second conduction type to surround the semiconductor layer of second conduction type on the surface of the semiconductor layer of first conduction type, and a metal layer disposed so as to contact the semiconductor layer of first conduction type and the semiconductor layer of second conduction type. In this Schottky barrier diode, a width of a depletion layer is determined such that an inside of the junction barrier is filled with the depletion layer upon application of a voltage.

9 Claims, 5 Drawing Sheets

1: n+ TYPE SILICON SUBSTRATE
2: n- TYPE EPITAXIAL LAYER
3: SILICON OXIDE LAYER
4: SCHOTTKY METAL
5: ELECTRODE
6: GUARD RING
7: JUNCTION BARRIER
8: ELECTRODE

1: n+ TYPE SILICON SUBSTRATE
2: n- TYPE EPITAXIAL LAYER
3: SILICON OXIDE LAYER
4: SCHOTTKY METAL
5: ELECTRODE
6: GUARD RING
7: JUNCTION BARRIER
8: ELECTRODE

SCHOTTKY BARRIER DIODE AND MANUFACTURING METHOD THEREOF

BACKGROUND OF THE INVENTION

The present invention relates to a Schottky barrier diode and a manufacturing method thereof, and more specifically, to improvement of a withstanding voltage characteristic.

A Schottky junction, formed by a contact between a semiconductor (substrate) and metal (layer) having a different work function, is well known as a Schottky barrier diode, since it has a rectifying action by a barrier. This Schottky barrier diode has a low forward voltage drop and a good high-speed response characteristic, and thus is widely used as a switching power source. Furthermore, in such switching power source, the forward drop voltage of the Schottky barrier diode performing a rectification is a major factor to determine an effectiveness of the power source, and the forward voltage drop is desired to be lower, if possible. In addition, from the viewpoint of a circuit design, a withstanding voltage exceeding a rating voltage is often needed for a Schottky barrier diode.

For example, as shown in FIG. 4, a Schottky barrier diode formed from an $n^-$ type semiconductor layer 32 formed on an $n^+$ type semiconductor substrate 31, and a Schottky metal layer 36 which forms a Schottky junction at an interface with the $^-$ type semiconductor layer 32 is considered. This metal layer is made of, for instance, Ti. An Al layer, which is an anode electrode 37, is provided in order to cover the entire surface of the metal layer. In addition, a guard ring 34, into which $p^+$ type impurity is diffused for coming by a withstanding voltage, is provided in an outer periphery of the semiconductor substrate, and a part thereof is contact to the Schottky metal layer 36.

However, a height of the Schottky barrier in the Schottky junction, i.e., a work function difference thereof (hereinafter, referred to as "ΦBn") is a factor to determine a characteristic of the Schottky barrier diode. The ΦBn is a unique value of each metal.

When a positive voltage is applied to the metal layer side of the Schottky barrier diode a current flows. The voltage at this time is a forward voltage VF. On the other hand, when a positive voltage is applied to the n type silicon side and a negative voltage is applied to the metal layer side, the voltage at this time is a backward voltage. Concerning a certain Schottky barrier diode to which a backward voltage is applied, there is no current flow. At this time, as the ΦBn becomes larger, the forward voltage VF of the Schottky barrier diode becomes higher, but, in contrast, a leakage current IR becomes smaller. In other words, the forward voltage VF and the leakage current IR have a relationship of a trade-off.

Therefore, as shown in FIG. 5, a structure is widely used where a plurality of $p^+$ type regions 107 are provided in a $n^-$ type semiconductor layer 2. This enlarges a depletion layer by a pn junction upon application of a backward voltage, and thereby restricting leakage to a cathode side even if a leakage current is generated in a Schottky junction region.

For example, when withstanding voltage is 40V, the $n^-$ type semiconductor layer 2 is in need of a resistivity of 1 Ω·cm, and, when a withstanding voltage is 600V, the n– type semiconductor 2 is in need of one of 30 Ω·cm. A depth of the $p^+$ type region 107 depends on a withstanding voltage, but, in any cases, is about 1 μm (for example, refer to Japanese Patent Application Publication 2000-261004).

As described above, in the Schottky barrier diode in FIG. 4, there is a relationship of a trade-off that, as the ΦBn is higher, the VF is higher but the IR is smaller. In addition, when the ΦBn is identical, the values of the VF and the IR vary depending on an area of the Schottky junction.

Consequently, by decreasing a resistivity ρ of the $n^-$ type semiconductor layer 32, resistances of a current path can be reduced to design a low VF.

However, in such method, a resistivity of the $n^-$ type semiconductor layer 32 underlying the $p^+$ type region 34 to determine a withstanding voltage decreases as well. Thus, there is a problem in that it is impossible to come by a predetermined withstanding voltage since an extension of a depletion layer becomes insufficient.

In addition, in a structure shown in FIG. 5, a depth of a $p^+$ type region 107 is about 1 μm and very shallow compared with that of an $n^-$ type semiconductor layer 2. At the same time, a concentration of the impurity of the $n^-$ type semiconductor layer 2 is set to be low in order to come by a predetermined withstanding voltage. Therefore, if a current path is narrow due to provision of the $p^+$ type region 107, a low VF cannot be obtained.

As above, in the Schottky barrier diode, a desired characteristic can be obtained by properly selecting an area of the Schottky junction, a Schottky metal layer, a resistivity of the semiconductor layer and so on. However, it is actually difficult to obtain predefined characteristics of the VF and the IR, and at the same time come by a predetermined withstanding voltage. Because of above, a design of a Schottky barrier diode is practically made by a little sacrifice of any one thereof.

Therefore, a structure having a plurality of p type semiconductor region (junction barrier) with a pillar shape in an n-type semiconductor layer is proposed. The p type pillars are designed so as to reach an n+ type semiconductor substrate and arranged at a predetermined interval. In this structure, a depletion layer diffuses from the p type semiconductor region to a horizontal direction upon application of a backward voltage (Japanese Patent Application Publication 2005-243716). In such structure, since the depletion layer diffuses up to an inside of the p type semiconductor region, the n– type semiconductor layer 2 becomes an almost depleted region. The depletion layer diffuses almost uniformly along a depth direction (a vertical direction to the substrate) of the p type semiconductor region to be pinched off for maintaining a constant intensity of an electric field. Therefore, an electric field applied to a Schottky junction interface can be mitigated to restrict a backward leakage current.

In the Schottky barrier diode with such junction barrier, as shown in FIGS. 5 and 6, a structure has been proposed in which a width W between the junction barriers is set to satisfy 2w0<W<3D (where, w0: a width of the depletion layer, D: a depth of the junction barrier), and thus Schottky characteristics (a forward voltage VF, a backward leakage current IR) can be improved by a pinch-off effect (Japan Patent Application publication H7-50791).

SUMMARY OF THE INVENTION

However, there is a problem in even the structure disclosed in Patent Document H7-50791 in that, as shown in FIG. 7, according to increase of the width W between the junction barriers, the diffusion of the depletion layer 9 concentrates an electric filed on a round portion of a bottom of the junction barrier to reduce a withstanding voltage of an element.

The invention is made in consideration of the above-described circumstances, and is directed to provide a Schottky barrier diode in which a forward voltage is low, a backward leakage current is small, and a withstanding voltage of an element is high, by improving both the forward voltage VF and the backward leakage current IR.

The present invention provides Schottky barrier diode including a semiconductor substrate whose surface is provided with a semiconductor layer of first conduction type, a plurality of semiconductor layers of second conduction type as junction barriers provided at a predetermined depth from the surface of the semiconductor layer of first conduction type, an annular shape guard ring comprised of a semiconductor layer of second conduction type to surround the semiconductor layer of second conduction type on the surface of the semiconductor layer of first conduction type, and a metal layer disposed so as to contact the semiconductor layer of first conduction type and the semiconductor layer of second conduction type. In this Schottky barrier diode, a width of a depletion layer is determined such that an inside of the junction barrier is filled with the depletion layer upon application of a voltage.

In the Schottky barrier diode according to the invention, a width wp of the junction barrier is set to have a following relationship with a width wop of the depletion layer within the junction barrier: wp<2wop According to such configuration, the depletion layer diffuses within the junction barrier upon application of a voltage and the junction barrier is filled with the depletion layer so that a withstanding voltage can be maintained and a contact area between the semiconductor layer of first conduction type and the metal layer is increased. Thus, the Schottky barrier diode with a low forward voltage drop can be manufactured.

The Schottky barrier diode according to the invention further includes a guard ring comprised of a semiconductor layer of second conduction type formed in an annular shape to surround the semiconductor layer of second conduction type on the surface of the semiconductor layer of first conduction type.

In the Schottky barrier diode according to the invention, the semiconductor substrate is an $n^+$ silicon substrate provided with an $n^-$ epitaxial growth layer as a semiconductor layer of first conduction type, and the junction barrier is set to have an impurity concentration so as to pinch off the $n^-$ epitaxial growth layer due to diffusion of the depletion layer from the junction barrier upon application of a backward voltage.

In the Schottky barrier diode according to the invention, the metal layer comprises a Schottky metal layer including one of Ni, Mo and Ti, and an electrode layer including Al.

According another aspect of the invention, there is provided a method of manufacturing a Schottky barrier diode including a semiconductor substrate whose surface is provided with a semiconductor layer of first conduction type, a plurality of semiconductor layers of second conduction type as junction barriers provided at a predetermined depth from the surface of the semiconductor layer of first conduction type, and a metal layer disposed so as to contact the semiconductor layer of first conduction type and the semiconductor layer of second conduction type. In this method, a process of forming the junction barriers includes the steps of determining a width of the depletion layer such that an inside of the junction barrier is filled with the depletion layer upon application of a voltage, forming a mask pattern to provide an aperture in a region in which the junction barriers is formed, and implanting impurities so that the depletion layer have the predetermined width at the determining step.

In the method of manufacturing the Schottky barrier diode according to the invention, the determining step is performed such that the width wp of the junction barrier has a following relationship with the width wop of the depletion layer within the junction barrier upon application of a voltage: wp<2wop The method of manufacturing the Schottky barrier diode according to the invention further includes a step providing a guard ring comprised of a semiconductor layer of second conduction type formed in an annular shape to surround the semiconductor layer of second conduction type on the surface of the semiconductor layer of first conduction type.

In the method of manufacturing the Schottky barrier diode according to the invention, the semiconductor substrate is an $n^+$ silicon substrate provided with an $n^-$ epitaxial growth layer as a semiconductor layer of first conduction type, and the determining step includes a step of setting an impurity concentration and a width of the depletion layer so that the junction barrier has an impurity concentration so as to pinch off the $n^-$ epitaxial growth layer due to diffusion of the depletion layer from the junction barrier upon application of a backward voltage.

In the method of manufacturing the Schottky barrier diode according to the invention further includes a step of sequentially forming a Schottky metal layer including one of Ni, Mo and Ti, and an electrode layer including Al, as the metal layer.

According to such configuration, since the width of the junction barrier satisfies wp<2wop and thus the inside of the junction barrier is filled with the depletion layer upon application of a voltage to prevent reduction of a withstanding voltage, it is possible to restrict a forward voltage drop maximally and to maintain a withstanding voltage.

DESCRIPTION OF THE PREFERRED EMBODIMENTS

Hereinafter, embodiments of the invention will be described in detail with reference to drawings.

Figure 1:
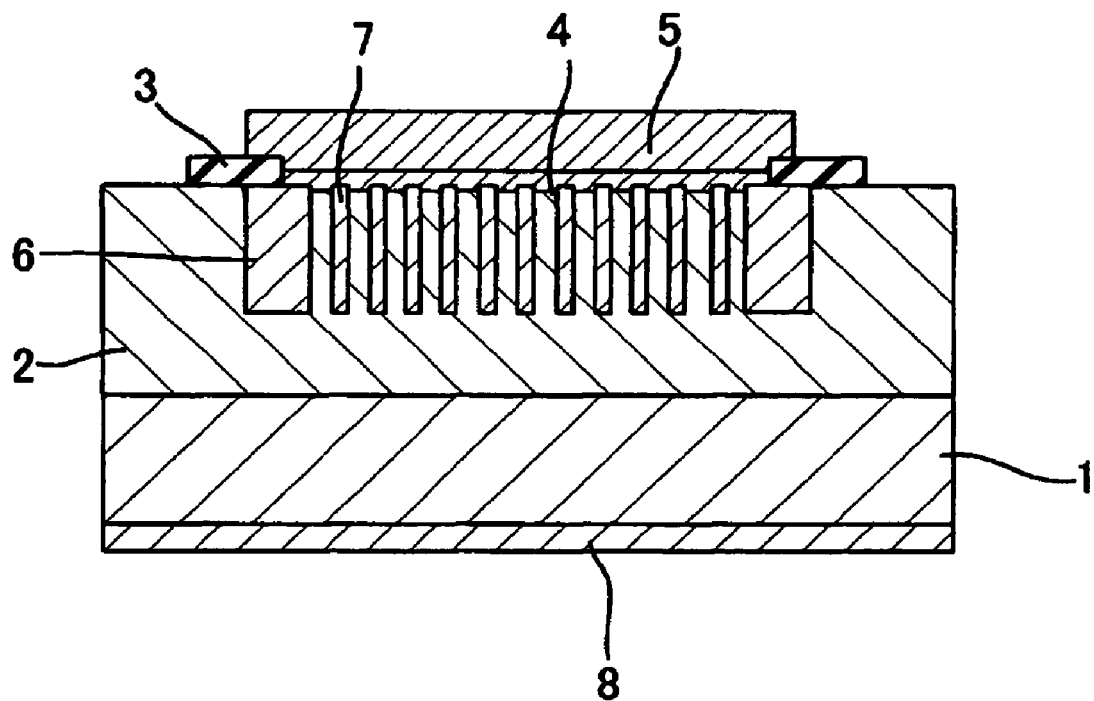
FIG. 1 is a sectional view illustrating a configuration of a Schottky barrier diode according to an embodiment of the invention.

FIG. 1 is a sectional view of a Schottky barrier diode according to an embodiment of the invention.

The Schottky barrier diode of the invention is based on an $n^+$ silicon substrate 1. On a surface of the $n^+$ silicon substrate 1, an $n^-$ silicon layer 2 of a low concentration is formed as a semiconductor layer of a first conduction type. In a predetermined depth from the surface of the $n^-$ silicon layer 2, a plurality of semiconductor layers of a second conduction type 7 is provided as junction barriers. In addition to the junction barriers 7, a guard ring 6 made form a semiconductor layer of second conduction type formed in an annular shape to surround the junction barriers 7 on the surface of the $n^-$ silicon layer 2. To make Schottky barrier, a Schottky metal 4 is disposed so as to contact the $n^-$ silicon layer 2 and the junction barriers 7. And a metal layer formed thereon as an electrode layer 5. A width wp of the junction barrier 7 and a width wop of a depletion layer within the junction barrier at the time of application of a voltage have a following characteristic relationship:

wp<2wop

In this embodiment, a Schottky connection state is formed by deposition of the Schottky metal 4 on a surface of the n⁻ silicon layer 2 which is exposed from an aperture of silicon oxide layer 3. The Schottky metal 4 is preferably made of Ni, Ti, Mo and the like. In addition, the guard ring 6 of highly doped p type semiconductor layer is formed in annular shape on a surface of the surface of the n⁻ silicon layer 2. High impurity concentration of the guard ring 6 is obtained by implanting boron using such an ion implanting method on the n⁻ silicon layer 2. The Schottky metal 4 is coated by the electrode 5 preferably made of Al. Furthermore, an electrode 8, which is preferably made of ohmic-contacted Au, Ag, and so on, is formed in a surface of the n⁺ silicon substrate 1 oppositely facing the n⁻ silicon layer 2.

Figure 2A:
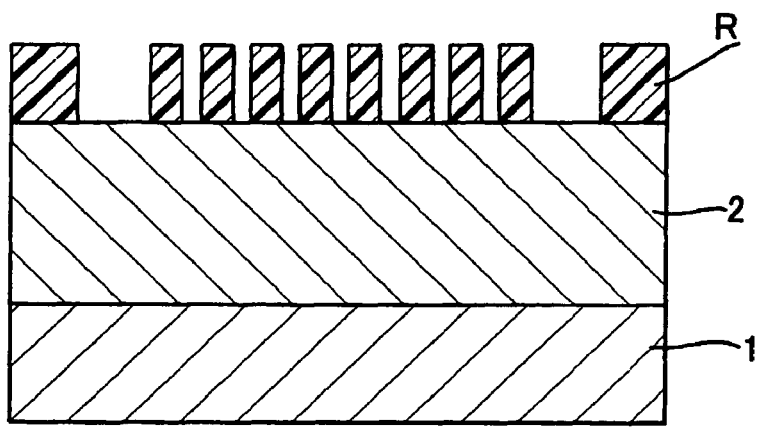
FIGS. 2A, 2B and 2C are sectional views illustrating processes of manufacturing the Schottky barrier diode according to the embodiment of the invention.
Figure 2B:
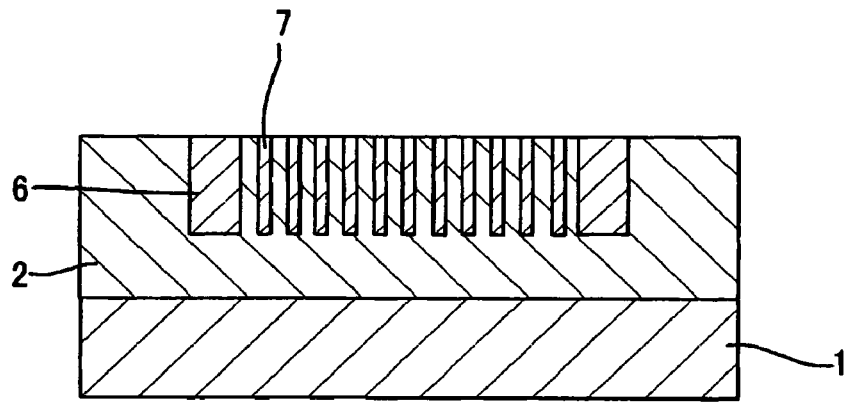
Figure 2C:
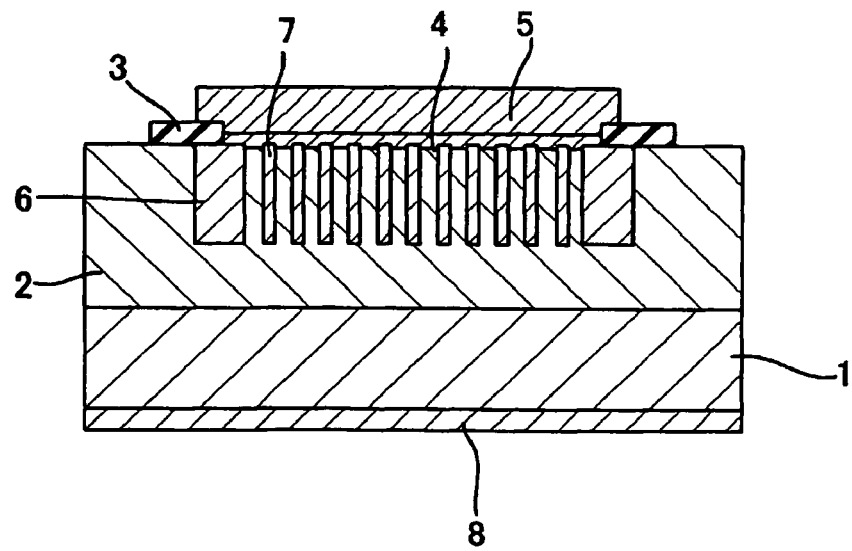

A manufacturing method of the Schottky barrier diode will now be described. From FIG. 2A to 2C illustrate manufacturing processes of the Schottky barrier diode. In this embodiment, the guard ring 6 and the junction barriers 7 are formed by a same gradient ion implantation process. The process of forming the junction barriers includes a first step of determining the width of the depletion layer under the voltage application so as to satisfy the following equation so that an inside of the junction barrier is filled with the depletion layer. The process of forming the junction barriers includes a second step of forming a mask pattern to provide an aperture in a region in which the junction barriers is formed. The process of forming the junction barriers includes a third step of implanting impurities to have the width of the depletion layer determined at the determining process. Other steps are the same as the typical method and thus will be described briefly herein.

wp<2wop (Equation)

where, wp is the width of the junction barrier and wop is the width of the depletion layer within the junction barrier upon application of a voltage.

First, as shown in FIG. 2A, the n⁻ silicon layer 2 of a low impurity concentration is formed on the surface of the n⁺ silicon substrate 1 by an epitaxial growth method. Then a resist R is coated thereon to form a resist pattern by a photolithography. The resist pattern provides the width of the junction barrier determined based on the above-described equation.

Figure 3:
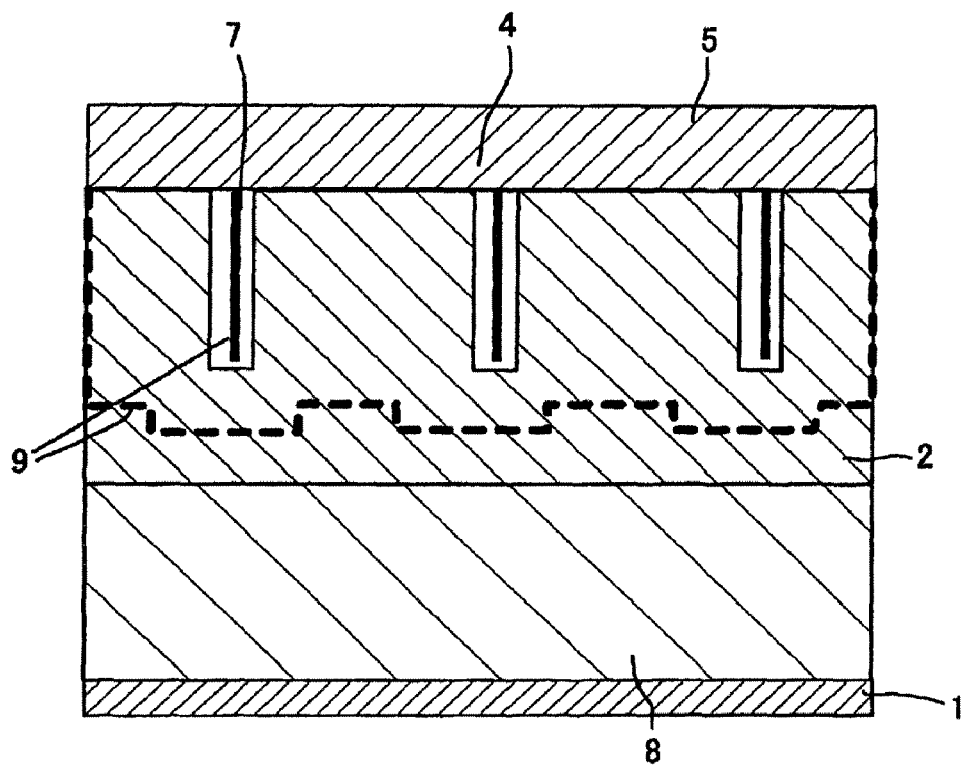
FIG. 3 is an explanatory view showing main parts in enlarged scale for illustrating a state upon application of a voltage to the Schottky barrier diode according to the embodiment of the invention.
Figure 4:
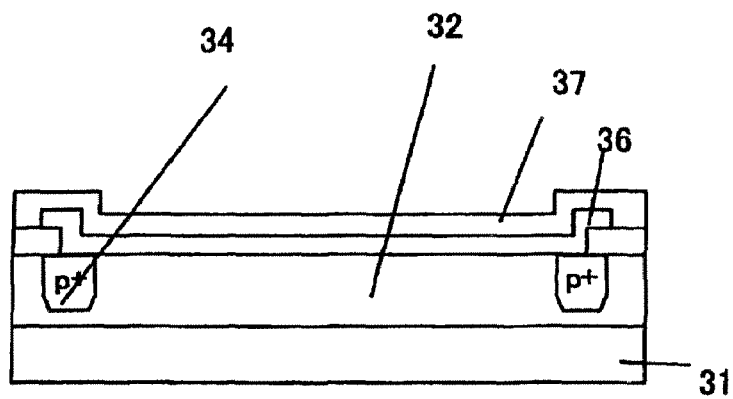
FIG. 4 is a sectional view illustrating a configuration of a known Schottky barrier diode.
Figure 5:
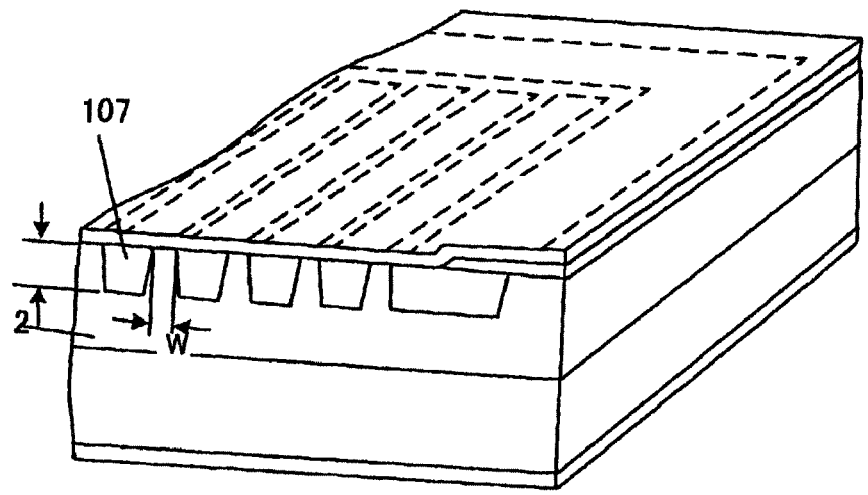
FIG. 5 is a sectional view illustrating a configuration of a known Schottky barrier diode.
Figure 6:
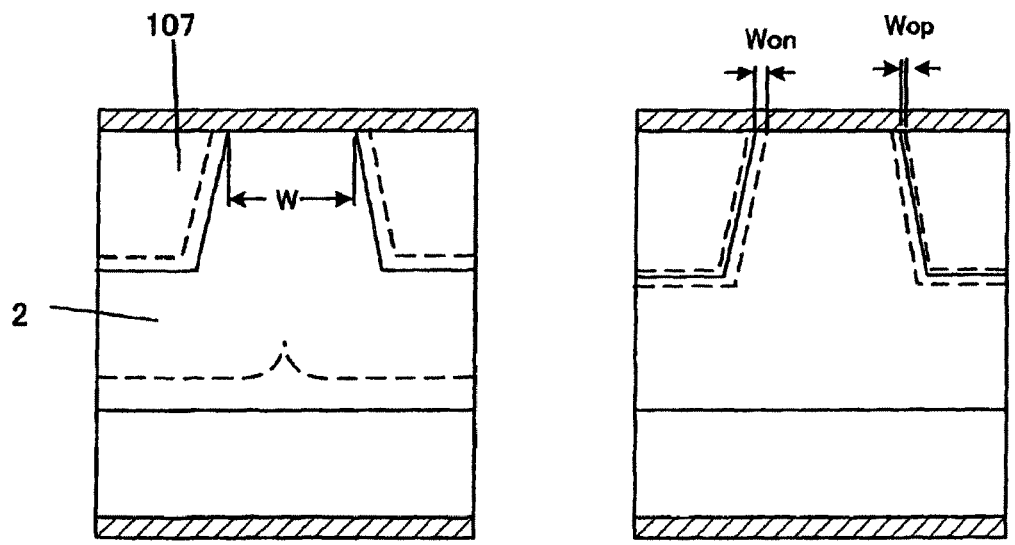
FIG. 6 is a sectional view illustrating a configuration of a known Schottky barrier diode.
Figure 7:
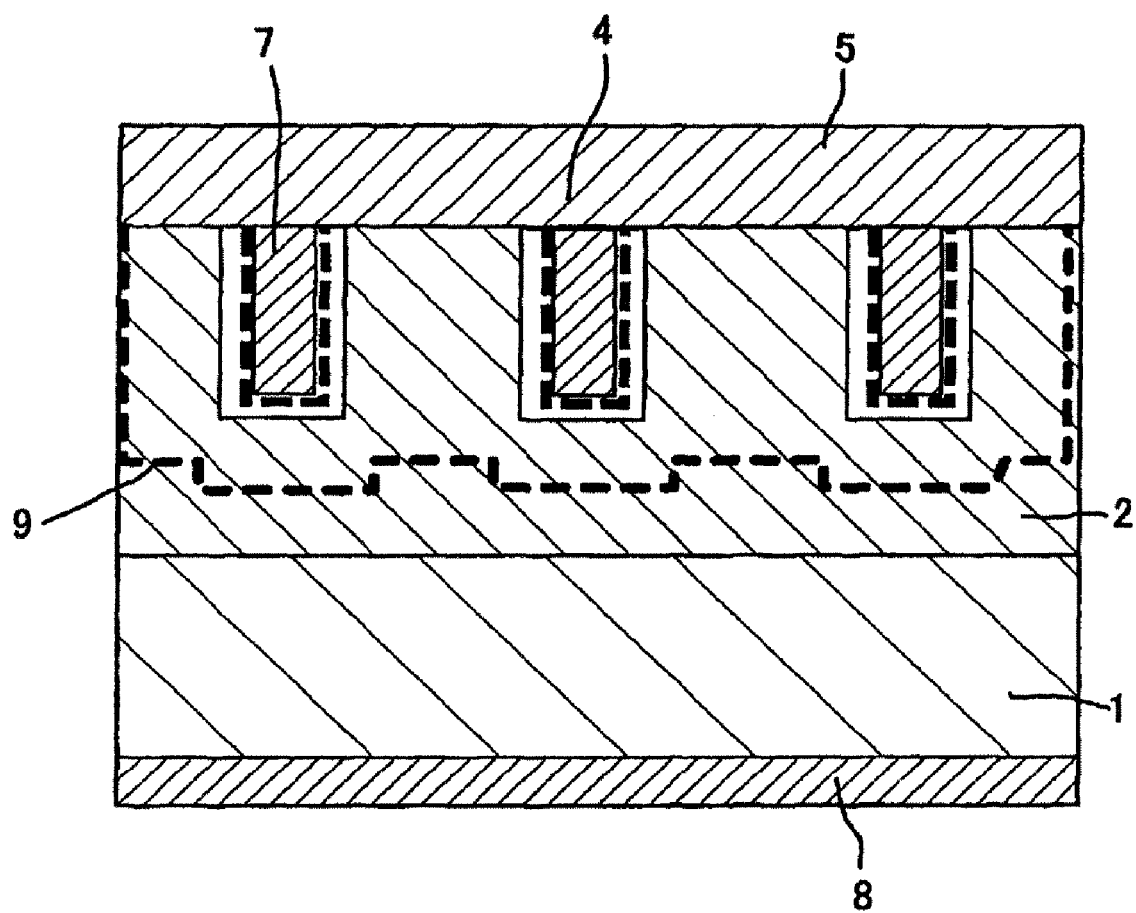
FIG. 7 is a sectional view illustrating a configuration of a known Schottky barrier diode.

In this case, the width wo of the depletion layer, as shown below, is represented by the sum of a width wop of the depletion layer extending within the junction barrier and a width won of the depletion layer inwards the n⁻ silicon layer. In addition, as shown in FIG. 3, when the inside of the junction barrier is filled with the depletion layer 9 under the application of a voltage, a following equation is satisfied:

$$w_p < 2w_{op} \quad \text{[Equation 2]}$$

$$w_o = w_{op} + w_{on}$$

$$N_p \times w_{op} = N_n \times w_{on}$$

$$w_o = \sqrt{\frac{2\varepsilon_s}{q}\left(\frac{N_n + N_p}{N_n \times N_p}\right)(V_{bi} + VR)}$$

-continued $$V_{bi} = \frac{kT}{q}\ln\frac{N_n \times N_p}{N_i^2}$$

$$w_{op} = \frac{w_0}{1 + \frac{N_p}{N_n}}$$

where, Nn: impurity concentration of n⁻ silicon layer
Np: impurity concentration of JB layer
Ni: impurity concentration of intrinsic semiconductor
Vbi: internal potential
VR: backward applying voltage
wo: width of depletion layer
wop: width of depletion layer within JB layer
won: width of depletion layer within n⁻ silicon layer
εs: permittivity of silicon
q: elementary electric charge
k: Boltzmann's constant
T: temperature For example, by setting the width wp of the junction barrier layer wp<2wop (where, wop: the width of the depletion layer within the junction barrier upon application of a voltage), the inside of the junction barrier layer is filled with the depletion layer upon application of a voltage and a withstanding voltage reduction is prevented.

The wop is obtained from the Nn and Np as follows. For example, if VR=40V, Nn=8E15 cm⁻³ and NP=1E17 cm⁻³, thus wp<0.4 μm. As described above, the Schottky barrier diode, which has no reduction of a withstanding voltage and has a high trade-off improving rate, can be obtained.

Thereafter, as shown in FIG. 2B, using the resist pattern as a mask, an ion implantation is performed to form the guard ring 6 and the junction barriers 7.

In this case, the junction barriers 7 has a low concentration, and the guard ring 6 and the junction barriers 7 are formed by the same ion implantation process and thus the junction barriers 7 are set to a desired concentration. The resist pattern R is removed after the ion implantation. Following an annealing for diffusion, the guard ring 6 and the junction barriers 7 are formed. In this case, the guard ring 6, which is the p type silicon layer of a high concentration, has a width of 30 μm, the junction barrier 7 has a width of 0.3 μm, and both of two have a depth of 2 μm and an impurity concentration of 1×10¹⁶/cm³~6×10¹⁷/cm³.

In addition, as shown in FIG. 2C, the silicon oxide layer 3 is formed on the surface thereof, which is then patterned by a photolithography to form an aperture. And then the Schottky metal 4 and the electrode 5 are formed and patterned so as to contact to the n⁻ silicon layer 2 provided with the guard ring 6 and the junction barriers 7. A protection layer (not shown) is formed thereon, if necessary, and finally the Schottky barrier diode is formed.

Other processes are the same as those of the conventional Schottky barrier diode.

According to the above-described configuration, as shown in FIG. 3, the inside of the junction barrier is filled with the depletion layer 9 upon application of a voltage, and thus the Schottky barrier diode, which has no reduction of a withstanding voltage and has a high trade-off improving rate, can be manufactured.

In addition, although nickel, molybdenum and titanium has been used for the Schottky metal layer in the above embodiment, a various kinds of metal such as vanadium, chrome, tungsten, palladium, platinum and the like are selectable, and, in the method of forming layers, other methods such as a vacuum deposition or a sputtering are applicable.

Moreover, although, in the embodiment, the dual layered structure of the Schottky metal 4 and the electrode 5 has been formed, a single layered structure is possible, if material with a low resistance and a work function in an optimal range is selectable.

Although the embodiment of the invention has been described, modes for carrying out the invention are not limited to the above-described drawings and the technique.

The invention is useful for a Schottky barrier diode applicable to a product of large current as well, because of no reduction of a withstanding voltage and a high trade-off improving rate.

What is claimed is:

1. A Schottky barrier diode comprising:
a semiconductor substrate on which surface a semiconductor layer of first conduction type is provided;
junction barrier layers including a plurality of semiconductor layers of second conduction type, and provided with a predetermined interval and at a predetermined depth from the surface of the semiconductor layer of the first conduction type; and
a metal layer disposed so as to contact the semiconductor layer of first conduction type and the junction barrier layers, wherein:
when a backward voltage is applied to the Schottky barrier diode, a width of a depletion layer of a junction between the semiconductor layer of the first conductive type and the semiconductor layers of second conduction type of the junction barrier layers is arranged such that an inside of the junction barrier layers is depleted, and
a width $w_p$ of each of the junction barrier layers is set to satisfy a following relationship with a width $w_{op}$ of the depletion layer within the junction barrier layers:

$$w_p < 2w_{op}$$

$$w_o = w_{op} + w_{on}$$

$$N_p \times w_{op} = N_n \times w_{on}$$

$$w_o = \sqrt{\frac{2\varepsilon_s}{q}\left(\frac{N_n + N_p}{N_n \times N_p}\right)(V_{bi} + VR)}$$

$$V_{bi} = \frac{kT}{q}\ln\frac{N_n \times N_p}{N_i^2}$$

$$w_{op} = \frac{w_0}{1 + \frac{N_p}{N_n}}$$

where,
$N_n$: impurity concentration of n⁻ silicon layer,
$N_p$: impurity concentration of junction barrier layers,
$N_i$: impurity concentration of intrinsic semiconductor,
$V_{bi}$: internal potential,
VR: backward applying voltage,
$w_o$: width of depletion layer,
$w_{op}$: width of depletion layer within junction barrier layers when the backward voltage is applied,
$w_{on}$: width of depletion layer within n⁻ silicon layer,
$\varepsilon_s$: permittivity of silicon,
q: elementary electric charge,
k: Boltzmann's constant, and
T: temperature.

2. The Schottky barrier diode according to claim 1 further comprising:
an annular shape guard ring comprised of a semiconductor layer of second conduction type to surround the semiconductor layers of second conduction type and formed in the semiconductor layer of first conduction type.

3. The Schottky barrier diode according to claim 1,
wherein the semiconductor substrate is an n⁺ silicon substrate on which an n⁻ epitaxial growth layer as a semiconductor layer of first conduction type is provided, and
wherein an impurity concentration of the junction barrier layers is set so as to pinch off the n⁻ epitaxial growth layer due to diffusion of the depletion layer from the junction barrier layers upon application of a backward voltage to the Schottky barrier diode.

4. The Schottky barrier diode according to claim 1,
wherein the semiconductor substrate is an n⁺ silicon substrate on which an n⁻ epitaxial growth layer as a semiconductor layer of first conduction type is provided, and
wherein an impurity concentration of the junction barrier layers is set so as to pinch off the n⁻ epitaxial growth layer due to diffusion of the depletion layer from the junction barrier layers upon application of a backward voltage to the Schottky barrier diode.

5. The Schottky barrier diode according to claim 2,
wherein the semiconductor substrate is an n⁺ silicon substrate on which an n⁻ epitaxial growth layer as a semiconductor layer of first conduction type is provided, and
wherein an impurity concentration of the junction barrier layers is set so as to pinch off the n⁻ epitaxial growth layer due to diffusion of the depletion layer from the junction barrier layers upon application of a backward voltage to the Schottky barrier diode.

6. The Schottky barrier diode according to claim 1,
wherein the metal layer is comprised of a Schottky metal layer including one of Ni, Mo and Ti, and an electrode layer including Al.

7. The Schottky barrier diode according to claim 1,
wherein the metal layer is comprised of a Schottky metal layer including one of Ni, Mo and Ti, and an electrode layer including Al.

8. The Schottky barrier diode according to claim 2,
wherein the metal layer is comprised of a Schottky metal layer including one of Ni, Mo and Ti, and an electrode layer including Al.

9. The Schottky barrier diode according to claim 3,
wherein the metal layer is comprised of a Schottky metal layer including one of Ni, Mo and Ti, and an electrode layer including Al.

* * * * *